United States Patent
Park et al.

(10) Patent No.: US 10,128,048 B2
(45) Date of Patent: Nov. 13, 2018

(54) MULTILAYER CAPACITOR AND BOARD HAVING THE SAME

(71) Applicant: SAMSUNG ELECTRO-MECHANICS CO., LTD., Suwon-si, Gyeonggi-do (KR)

(72) Inventors: Heung Kil Park, Suwon-si (KR); Jong Hwan Park, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/407,473

(22) Filed: Jan. 17, 2017

(65) Prior Publication Data

US 2017/0309403 A1 Oct. 26, 2017

(30) Foreign Application Priority Data

Apr. 25, 2016 (KR) .......................... 10-2016-0049825

(51) Int. Cl.
*H01G 4/228* (2006.01)
*H01G 4/30* (2006.01)
(Continued)

(52) U.S. Cl.
CPC ................ *H01G 4/30* (2013.01); *H01G 4/228* (2013.01); *H05K 1/111* (2013.01); *H05K 1/181* (2013.01); *H05K 2201/10015* (2013.01)

(58) Field of Classification Search
CPC ........... H01G 4/30; H01G 4/228; H01G 4/232
See application file for complete search history.

(56) References Cited

U.S. PATENT DOCUMENTS

2006/0187613 A1 8/2006 Yoshii et al.
2013/0050893 A1* 2/2013 Kim ................... H01G 4/228
 361/306.3
(Continued)

FOREIGN PATENT DOCUMENTS

JP 2001307947 A * 11/2001 ............. H01C 1/148
JP 2006186316 A * 7/2006
(Continued)

OTHER PUBLICATIONS

Office Action issued in corresponding Korean Application No. 10-2016-0049825, dated Jun. 1, 2017; with English translation.

*Primary Examiner* — Eric Thomas
(74) *Attorney, Agent, or Firm* — McDermott Will & Emery LLP

(57) ABSTRACT

A multilayer capacitor includes a body including a capacitor body formed by layering a plurality of dielectric layers and a plurality of first and second internal electrodes in a width direction, the first and second internal electrodes including body portions overlapping each other and lead portions exposed to a mounting surface of the capacitor body and disposed to be spaced apart from each other, respectively; and first, second and third external electrodes disposed on the mounting surface of the capacitor body to be connected to the lead portions, respectively, wherein the first, second and third external electrodes each include first, second and third electrode layers which are sequentially stacked, the first and second electrode layers containing metal and glass particles, and the third electrode layer containing a conductive resin.

10 Claims, 8 Drawing Sheets

(51) Int. Cl.
*H05K 1/11* (2006.01)
*H05K 1/18* (2006.01)

(56) References Cited

U.S. PATENT DOCUMENTS

| | | |
|---|---|---|
| 2013/0242457 A1 | 9/2013 | Lee et al. |
| 2014/0160616 A1* | 6/2014 | Yoon ........................ H01G 4/12 |
| | | 361/301.4 |
| 2014/0160621 A1* | 6/2014 | Yoon ........................ H01G 4/30 |
| | | 361/301.4 |
| 2015/0014040 A1* | 1/2015 | Ahn ........................ H01G 4/30 |
| | | 174/260 |
| 2015/0022945 A1* | 1/2015 | Park ........................ H01G 4/30 |
| | | 361/301.4 |
| 2015/0083477 A1* | 3/2015 | Lee ........................ H01G 4/012 |
| | | 174/260 |
| 2015/0114704 A1 | 4/2015 | Park et al. |
| 2015/0279563 A1 | 10/2015 | Otani |
| 2016/0049250 A1 | 2/2016 | Ahn et al. |

FOREIGN PATENT DOCUMENTS

| | | |
|---|---|---|
| JP | 2015-026843 A | 2/2015 |
| JP | 2006-229077 | 8/2017 |
| KR | 10-2013-0104360 A | 9/2013 |
| KR | 10-1514610 B1 | 4/2015 |
| KR | 10-2015-0050326 A | 5/2015 |
| KR | 10-2015-0086343 A | 7/2015 |

* cited by examiner

I-I'

MULTILAYER CAPACITOR AND BOARD HAVING THE SAME

CROSS-REFERENCE TO RELATED APPLICATION(S)

This application claims the benefit of priority to Korean Patent Application No. 10-2016-0049825, filed on Apr. 25, 2016 in the Korean Intellectual Property Office, the entire disclosure of which is incorporated herein by reference.

TECHNICAL FIELD

The present disclosure relates to a multilayer capacitor and a board having the same.

BACKGROUND

A decoupling capacitor is commonly mounted in a power supply circuit, such as a large scale integrated circuit (LSI).

Such a decoupling capacitor may serve to suppress a source voltage variation of the LSI through charging and discharging the capacitor to ensure performance of the LSI.

In accordance with the recent trend for multifunctionality and high integration in the LSI, current consumption is increased, and an overcurrent may be rapidly generated in a power supply circuit due to an increase in a driving frequency, such that there may be a need to increase the capacitance of the decoupling capacitor and decrease an equivalent series inductance (ESL) of the decoupling capacitor.

In addition, as miniaturization of an electronic component has been required due to information communications devices becoming portable, demand for a high-performance decoupling capacitors having excellent reliability and durability has increased.

Meanwhile, recently, as a plurality of in-vehicle cameras and image processing systems have been connected to in an electrical control unit (ECU) of a vehicle, a high-speed, high-performance LSI has been required in order to perform high-speed information processing and data communications.

Since the ECU is used in an environment which may have wide temperature variations and vibrations and impacts are experienced for prolonged periods of time, in an electronic component, particularly, a multilayer capacitor, used in the ECU, excellent durability against thermal and mechanical stress and long-term reliability have been required.

SUMMARY

An aspect of the present disclosure may provide a multilayer capacitor having excellent durability and reliability while having low ESL, and a board having the same.

According to an aspect of the present disclosure, a multilayer capacitor includes a body formed by layering a plurality of dielectric layers and a plurality of first and second internal electrodes in a width direction, the first and second internal electrodes including body portions overlapping each other and lead portions exposed to a mounting surface of the body and disposed to be spaced apart from each other, respectively; and first, second and third external electrodes disposed on the mounting surface of the body to be connected to the lead portions, respectively, wherein the first, second and third external electrodes each include first, second and third electrode layers which are sequentially stacked, the first and second electrode layers containing metal and glass particles, and the third electrode layer containing a conductive resin, and a board having the same may be provided.

BRIEF DESCRIPTION OF THE DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will now be described in detail with reference to the accompanying drawings.

Hereinafter, directions of a hexahedron will be defined in order to clearly describe exemplary embodiments in the present disclosure. L, W and T directions shown in the accompanying drawings refer to a length direction, a width direction, and a thickness direction, respectively.

Here, the width direction may be the same as a layering direction in which dielectric layers are stacked.

Multilayer Capacitor

Figure 1:
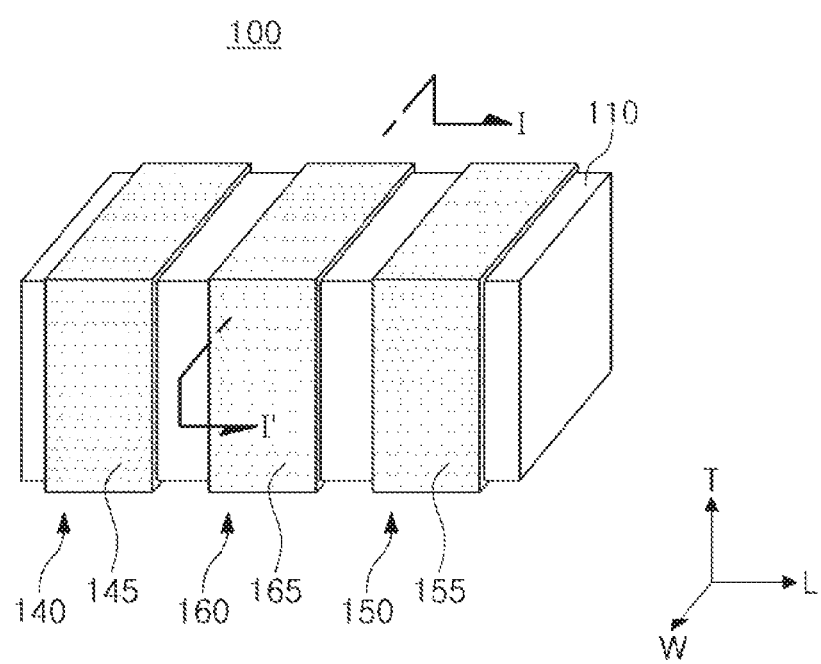
FIG. 1 is a perspective view schematically illustrating a multilayer capacitor according to an exemplary embodiment in the present disclosure in an inverted state.
Figure 2:
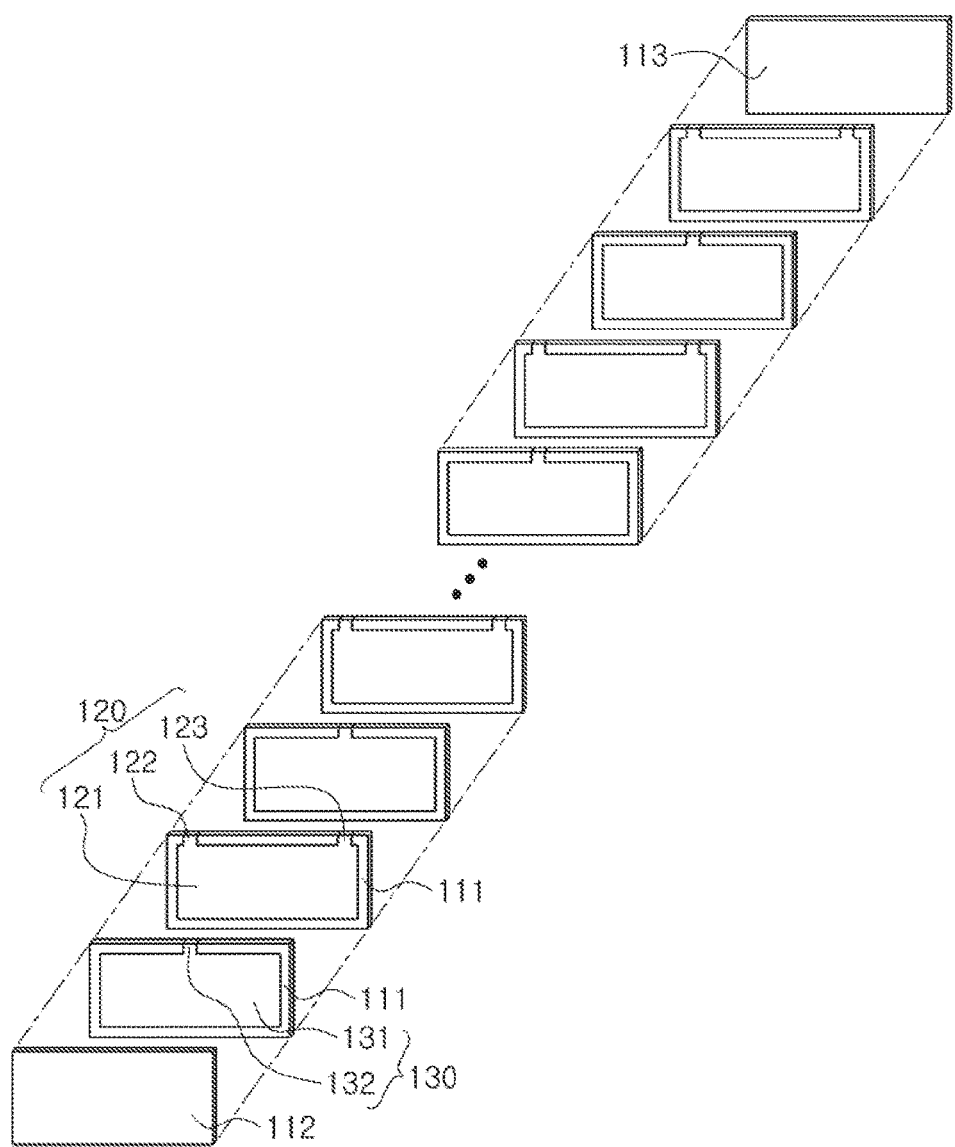
FIG. 2 is an exploded perspective view illustrating a layered structure of internal electrodes in a body of FIG. 1.
Figure 3:
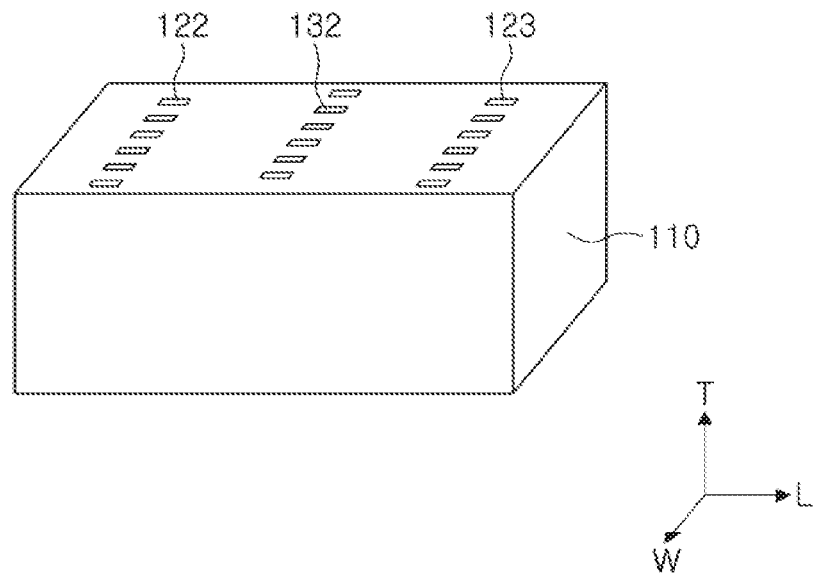
FIG. 3 is a perspective view illustrating the body of FIG. 1.
Figure 4:
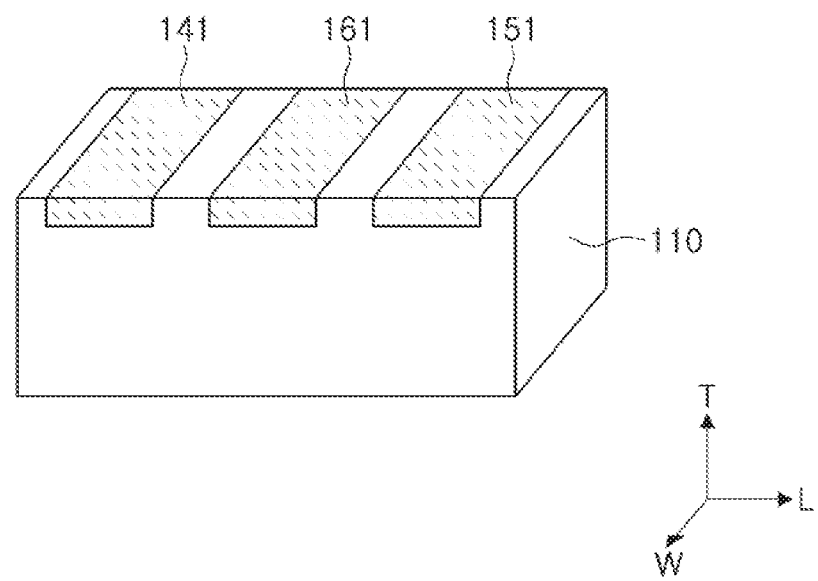
FIG. 4 is a perspective view illustrating a state in which a first electrode layer is disposed on the body of FIG. 3.
Figure 5:
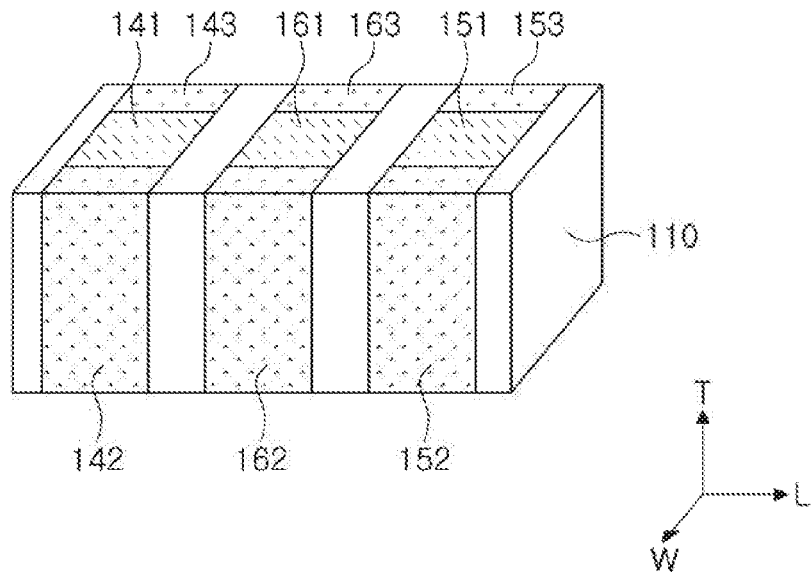
FIG. 5 is a perspective view illustrating a state in which a second electrode layer is further disposed on the body of FIG. 4.
Figure 6:
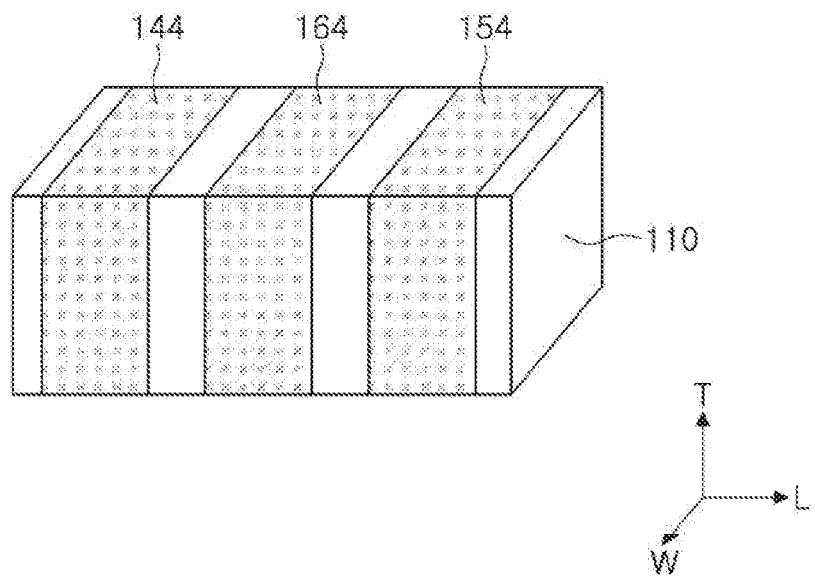
FIG. 6 is a perspective view illustrating a state in which a third electrode layer is further disposed on the body of FIG. 5.

FIG. 1 is a perspective view schematically illustrating a multilayer capacitor according to an exemplary embodiment in the present disclosure in an inverted state, FIG. 2 is an exploded perspective view illustrating a layered structure of internal electrodes in a body of FIG. 1, FIG. 3 is a perspec- tive view illustrating the body of FIG. 1, FIG. 4 is a perspective view illustrating a state in which a first electrode layer is disposed on the body of FIG. 3, FIG. 5 is a perspective view illustrating a state in which a second electrode layer is further disposed on the body of FIG. 4, and FIG. 6 is a perspective view illustrating a state in which a third electrode layer is further disposed on the body of FIG. 5.

Referring to FIGS. 1 through 6, a multilayer capacitor 100 according to the present exemplary embodiment may include a body 110 and first, second and third external electrodes 140, 160, and 150.

The body 110 may include a plurality of dielectric layers 111 stacked therein in the width direction and a plurality of first and second internal electrodes 120 and 130 alternately disposed in the width direction with respective dielectric layers 111 interposed therebetween.

The body 110 may be formed by layering the plurality of dielectric layers 111 and the first and second internal electrodes 120 and 130 in the width direction and sintering the stacked dielectric layers and internal electrodes, and a shape of the body 110 is not particularly limited, but may have a substantially hexahedral shape as illustrated.

Here, the body 110 may have first and second surfaces opposing each other in the thickness (T) direction, third and fourth surfaces connecting the first and second surfaces to each other and opposing each other in the length (L) direction, and fifth and sixth surfaces opposing each other in the width (W) direction.

Hereinafter, in the present exemplary embodiment, a description will be provided on the assumption that amounting surface of the multilayer capacitor 100 is the first surface of the body 110 and is an upper surface of the body 110 in FIG. 1.

The dielectric layers 111 may be in a sintered state, and adjacent dielectric layers 111 may be integrated with each other so that boundaries therebetween are not readily apparent without using a scanning electron microscope (SEM).

In this case, a thickness of the dielectric layer 111 may be suitably changed according to a capacitance design of the multilayer capacitor 100.

Further, the dielectric layer 111 may contain a ceramic powder having high permittivity, for example, a barium titanate ($BaTiO_3$)-based powder, a strontium titanate ($SrTiO_3$)-based powder, magnesium titanate, or the like, but the material of the dielectric layer 111 is not limited thereto as long as sufficient capacitance may be obtained.

In addition, if necessary, at least one of a ceramic additive, an organic solvent, a plasticizer, a binder, a dispersant, and the like, may be further added to the dielectric layer 111 together with the ceramic powder.

Further, covers 112 and 113 may be disposed on both outermost portions of the body 110 in the width direction as margins.

The covers 112 and 113 may have the same material and configuration as those of the dielectric layer 111 except that internal electrodes are not included therein.

The covers 112 and 113 may be formed by layering one or two or more dielectric layers on both outermost portions of the body 110 in the width direction, respectively, and may generally serve to prevent the first and second internal electrodes 120 and 130 from being damaged by physical or chemical stress.

The first and second internal electrodes 120 and 130, which are electrodes applied with different polarities, may be alternately disposed in the body 110 with respective dielectric layers 111 interposed therebetween in the width direction.

In this case, the first and second internal electrodes 120 and 130 may be electrically insulated from each other by the dielectric layer 111 disposed therebetween.

In addition, a material forming the first and second internal electrodes 120 and 130 is not particularly limited. For example, the first and second internal electrodes 120 and 130 may be formed using a conductive paste formed of one or more of noble metal materials such as palladium (Pd), a palladium-silver (Pd—Ag) alloy, or the like, nickel (Ni), and copper (Cu).

Here, as a printing method of the conductive paste, a screen printing method, a gravure printing method, or the like, may be used, but the printing method is not limited thereto.

Further, the first and second internal electrodes 120 and 130 according to the present exemplary embodiment may be disposed to be spaced apart from the third and fourth surfaces of the body 110 by a predetermined distance, and margins in the length direction may be formed in the body 110 in accordance with a spaced distance.

The first internal electrode 120 may include a first main portion 121 overlapping a second main portion (to be described below) of the second internal electrode 130 disposed adjacent thereto in the width direction to contribute to capacitance formation, and first and second lead portions 122 and 123 extended from the first main portion 121 to thereby be exposed to the first surface of the body 110, respectively.

In this case, the first and second lead portions 122 and 123 may be disposed to be spaced apart from each other in the length direction of the body 110, and contact first and third external electrodes 140 and 150 to thereby be electrically connected thereto, respectively.

The second internal electrode 130 may include the second main portion 131 overlapping the first main portion 121 of the first internal electrode 120 disposed adjacent thereto in the width direction to contribute to capacitance formation, and a third lead portion 132 extended from the second main portion 131 to thereby be exposed to the first surface of the body 110.

Further, the third lead portion 132 may be disposed between the first and second lead portions 122 and 123 in the length direction of the body 110, and contact the second external electrode 160 to thereby be electrically connected thereto.

In a general multilayer capacitor, since external electrodes are disposed on both ends of a body opposing each other in a length direction of the body, at the time of applying an alternating current to the external electrodes, a current path is relatively long, and thus, a current loop may be formed to be larger, which may increase a size of an induced magnetic field, thereby causing an increase in inductance of an electronic component.

In the present exemplary embodiment, since all of the first, second and third external electrodes 140, 160, and 150 are disposed on the first surface of the body 110, a current path may be shortened, and thus, the current loop may be decreased, thereby decreasing inductance of an electronic component.

The first, second and third external electrodes 140, 160, and 150 may be sequentially disposed on the first surface of the body 110 to be spaced apart from each other in the length direction of the body 110.

Further, the first and third external electrodes 140 and 150 may be disposed to be spaced apart from the third and fourth surfaces of the body 110 in the length direction.

Here, the first, second and third external electrodes 140, 160, and 150 may include first electrode layers 141, 161, and 151, second electrode layers 142, 143, 162, 163, 152, and 153, and third electrode layers 144, 164, and 154 which are sequentially stacked from the body 110.

The first electrode layers 141, 161, and 151 may contain metal and glass particles, may be disposed on the first surface, the mounting surface, of the body 110, and may contact exposed portions of the first, third, and second lead portions 122, 132, and 123, respectively, to serve to electrically connect internal and external electrodes corresponding to each other, respectively.

The second electrode layers 142, 143, 162, 163, 152, and 153 may contain metal and glass particles and may extend to cover portions of the first electrode layers 141, 161, and 151 on the fifth and sixth surfaces of the body 110 in the width direction, respectively.

As another example, the second electrode layers 142, 143, 162, 163, 152, and 153 may contain a conductive resin and may extend to cover portions of the first electrode layers 141, 161, and 151 on the fifth and sixth surfaces of the body 110 in the width direction, respectively. In this case, the second electrode layers 142, 143, 162, 163, 152, and 153 may protect the body from mechanical stress due to elastic force of the conductive resin.

In addition, the second electrode layers 142, 143, 162, 163, 152, and 153 may extend from the fifth and sixth surfaces of the body 110 in the width direction to portions of the second surface of the body 110, respectively, thereby increasing adhesion strength of the first, second and third external electrodes 140, 160, and 150.

The third electrode layers 144, 164, and 154 may contain a conductive resin and be formed to entirely cover the first electrodes layers 141, 161, and 151 and the second electrode layers 142, 143, 162, 163, 152, and 153, respectively.

Furthermore, plating layers 145, 165, and 155 may be further formed on the third electrode layers 144, 164, and 154, respectively, wherein the plating layers 145, 165, and 155 may include nickel (Ni) plating layers and tin (Sn) plating layers formed on the nickel (Ni) plating layers, respectively, but are not limited thereto.

Figure 7A:
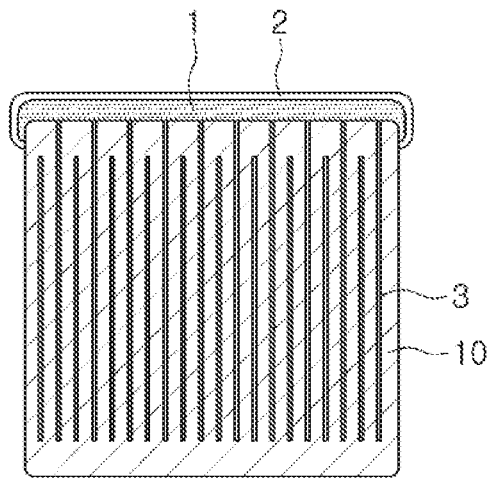
FIG. 7A is a cross-sectional view illustrating a moisture infiltration path in a multilayer capacitor according to the related art.

Referring to FIG. 7A, in a multilayer capacitor according to the related art, a plating layer 2 simply covers a circumference of an external electrode 1, such that a portion of a body on which an end portion of a band of the external electrode 1 is positioned may be vulnerable to infiltration of water. That is, water may infiltrate into internal electrodes 3 exposed to an upper surface of a body 10 through this portion of the body 10, thereby causing a reliability deterioration problem such as a decrease in insulation resistance, or the like.

Figure 7B:
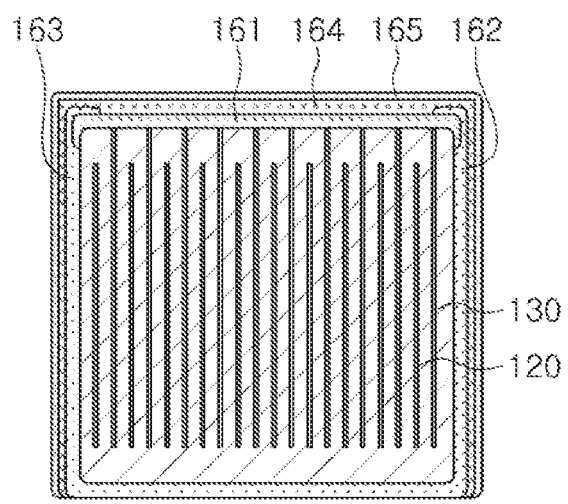
FIG. 7B is a cross-sectional view taken along line I-I' of FIG. 1.

However, referring to FIG. 7B, in the external electrodes according to the present exemplary embodiment, the water infiltration path as described above may be blocked through a triple layer structure, such that moisture resistance may be excellent due to an excellent shielding effect against water and moisture, and the reliability deterioration problem such as the decrease in insulation resistance, or the like, occurring in accordance with infiltration of water into exposed portions of the internal electrodes in a structure of the multilayer capacitor according to the related art may be effective prevented.

Further, heat generated in the body may be released to the outside by the second electrode layer extended to side surfaces of the body, such that reliability of a product may be increased, and an allowable value of a ripple current may be set to be high.

Modified Exemplary Embodiment

Figure 8:
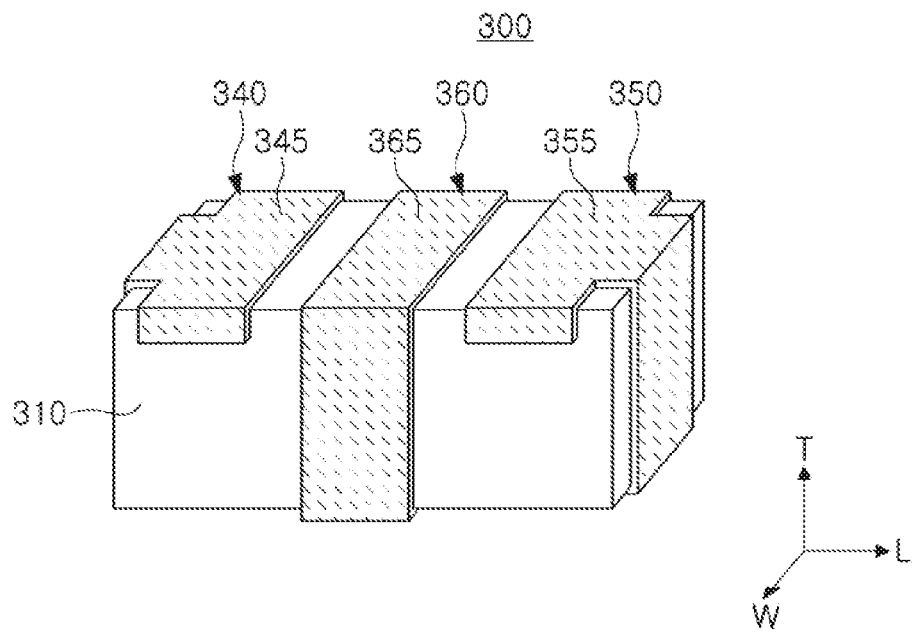
FIG. 8 is a perspective view schematically illustrating a multilayer capacitor according to another exemplary embodiment in the present disclosure in an inverted state.
Figure 9:
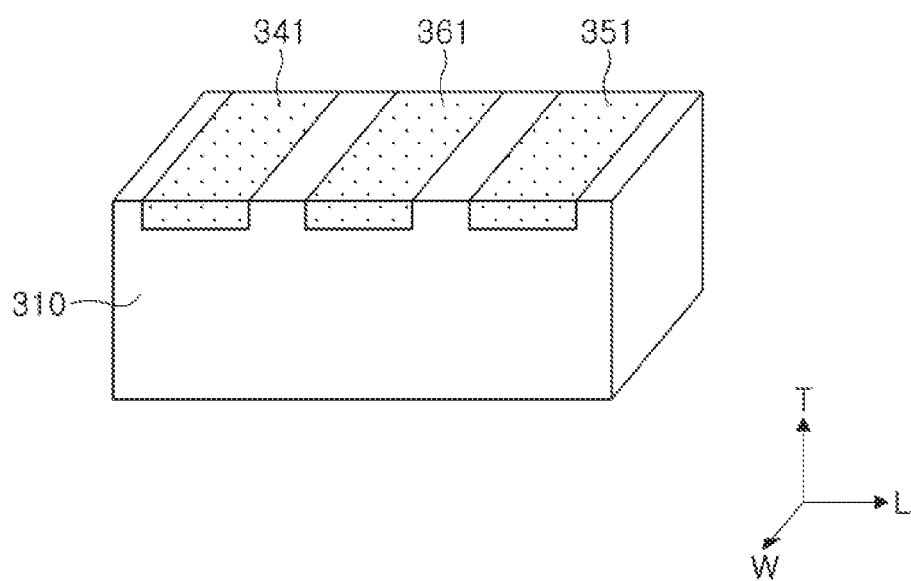
FIG. 9 is a perspective view illustrating a state in which a first electrode layer is disposed on a body of FIG. 8.
Figure 10:
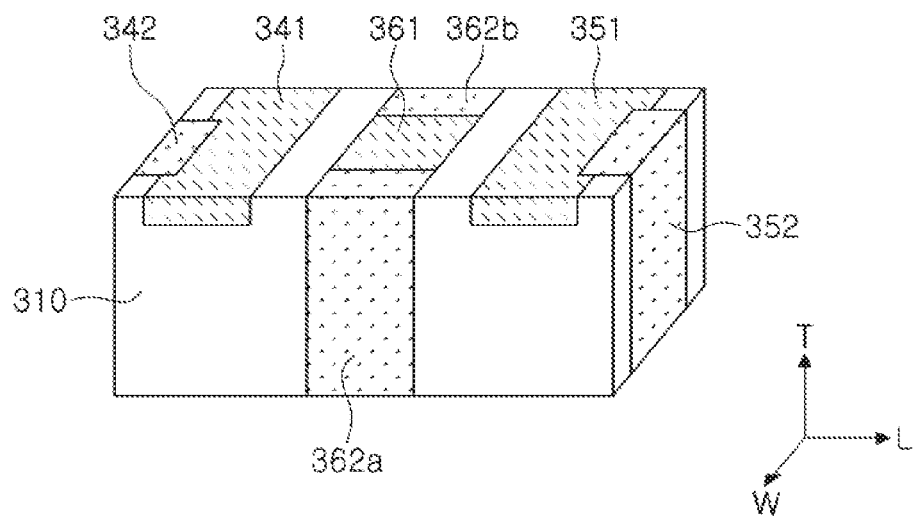
FIG. 10 is a perspective view illustrating a state in which a second electrode layer is further disposed on the body of FIG. 9.
Figure 11:
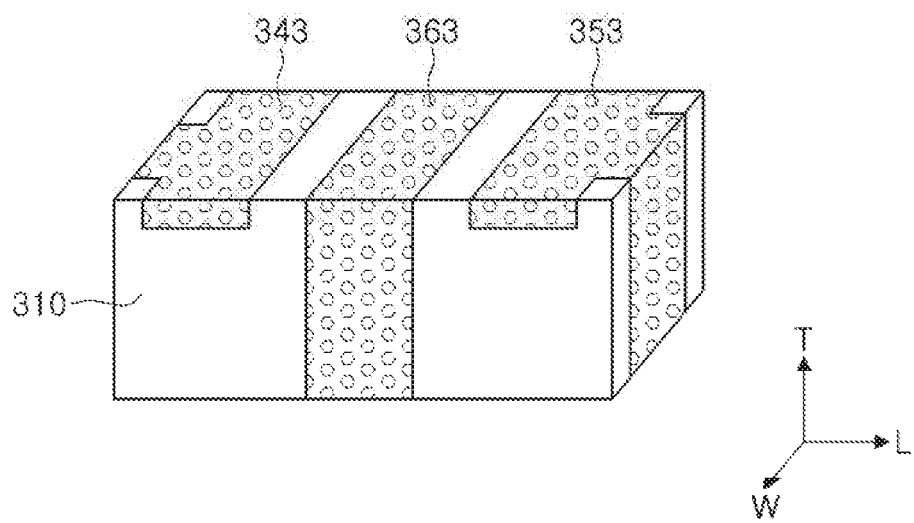
FIG. 11 is a perspective view illustrating a state in which a third electrode layer is further disposed on the body of FIG. 10.

FIG. 8 is a perspective view schematically illustrating a multilayer capacitor according to another exemplary embodiment in the present disclosure in an inverted state, FIG. 9 is a perspective view illustrating a state in which a first electrode layer is disposed on a body of FIG. 8, FIG. 10 is a perspective view illustrating a state in which a second electrode layer is further disposed on the body of FIG. 9, and FIG. 11 is a perspective view illustrating a state in which a third electrode layer is further disposed on the body of FIG. 10.

Here, a detailed description of the same portions as those in the exemplary embodiment described above will be omitted in order to avoid overlapped descriptions, and a structure of the external electrode having a different structure from that in the exemplary embodiment described above will be described in detail.

Referring to FIGS. 8 through 11, in a multilayer capacitor 300 according to the present exemplary embodiment, first, second and third external electrodes 340, 360, and 350 may be sequentially disposed on a first surface of a body 310 to be spaced apart from each other in a length direction of the body 310.

Here, the first, second and third external electrodes 340, 360, and 350 may include first electrode layers 341, 361, and 351, second electrode layers 342, 362a, 362b, and 352, and third electrode layers 343, 363, and 353 which are sequentially stacked from the body 310.

The first electrode layers 341, 361, and 351 may contain metal and glass particles, may be disposed on the first surface, a mounting surface, of the body 310, and may contact exposed portions of first, third, and second lead portions 122, 132, and 123 as described above, respectively, to serve to electrically connect internal and external electrodes corresponding to each other, respectively.

The second electrode layers 342, 362a, 362b, and 352 may contain metal and glass particles.

In the cases of the first and third external electrodes 340 and 350, the second electrode layers 342 and 352 may be connected from third and fourth surfaces of the body 310 in the length direction to portions of the first electrode layers 341 and 351 to thereby be electrically connected thereto. Here, the second electrode layers 342 and 352 may extend from the third and fourth surfaces of the body 310 in the length direction to portions of a second surface of the body 310, respectively, thereby improving adhesion strength of the first and third external electrodes 340 and 350.

In the case of the second external electrode 360, the second electrode layers 362a and 362b may extend from fifth and sixth surfaces of the body 310 in a width direction to portions of the first electrode layer 361, respectively. Here, the second electrode layers 362a and 362b may extend from the fifth and sixth surfaces of the body 310 in the width direction to portions of the second surface of the body 310, respectively, thereby improving adhesion strength of the second external electrode 360.

The third electrode layers 343, 363, and 353 may contain a conductive resin and may be formed to entirely cover the first electrodes layers 341, 361, and 351 and the second electrode layers 342, 362a, 362b, and 352, respectively.

Furthermore, plating layers 345, 365, and 355 may be further formed on the third electrode layers 343, 363, and 353, respectively, wherein the plating layers 345, 365, and 355 may include nickel (Ni) plating layers and tin (Sn) plating layers formed on the nickel (Ni) plating layers, respectively, but are not limited thereto.

When the structure of the second electrode layer is changed as in the present exemplary embodiment, since at the time of mounting the multilayer capacitor on a circuit board, a distance between solder applied to the second external electrode and solder applied to the first and third external electrodes may be increased, a solder bridge phenomenon may be prevented.

Board Having Multilayer Capacitor

Figure 12:
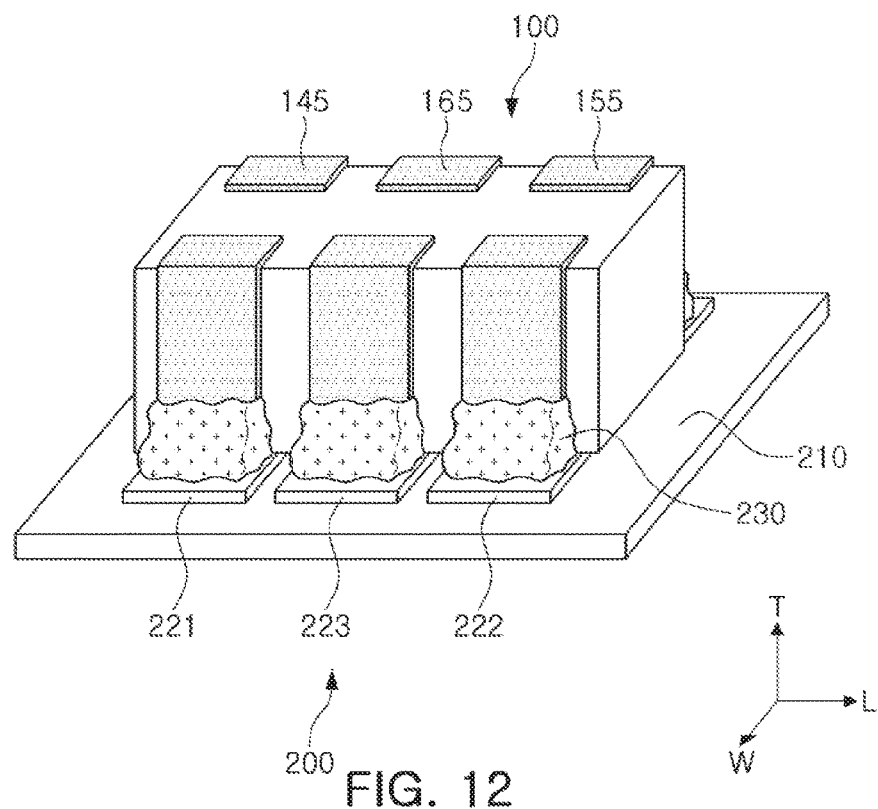
FIG. 12 is a perspective view illustrating a board in a state in which the multilayer capacitor of FIG. 1 is mounted on a circuit board.

FIG. 12 is a perspective view illustrating a board in a state in which the multilayer capacitor of FIG. 1 is mounted on a circuit board.

Referring to FIG. 12, a board 200 having a multilayer capacitor 100 according to the present exemplary embodiment may include a circuit board 210 on which the multilayer capacitor 100 is mounted, and first, second and third electrode pads 221, 223 and 222 formed on the circuit board 210 to be spaced apart from each other.

In this case, the multilayer capacitor 100 may be adhered to the circuit board 210 by a solder 230 to thereby be electrically connected thereto in a state in which the plating layers 145, 165, and 155 of the first, second and third external electrodes are positioned to contact the first, second and third electrode pads 221, 223 and 222, respectively.

Although the board in a state in which the multilayer capacitor of FIG. 1 is mounted on the circuit board is illustrated is described in the present exemplary embodiment, but the board is not limited thereto.

Figure 13:
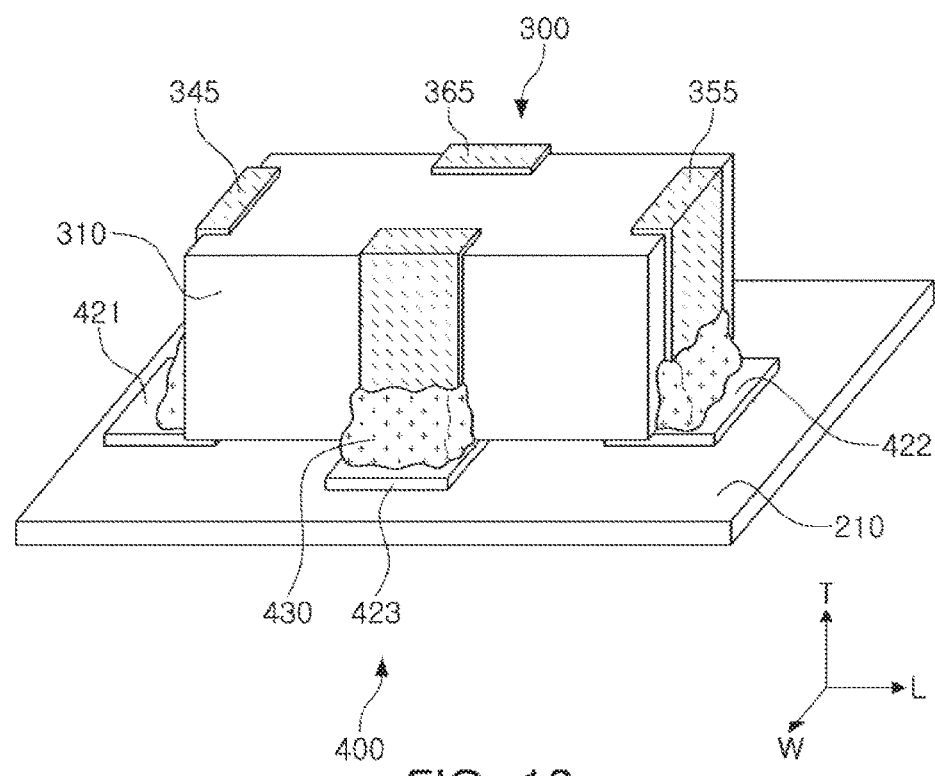
FIG. 13 is a perspective view illustrating a board in a state in which the multilayer capacitor of FIG. 8 is mounted on a circuit board.

As an example, a board having a multilayer capacitor may be configured by mounting the multilayer capacitor illustrated in FIG. 8, or the like, on a circuit board in a similar structure as illustrated in FIG. 13.

As set forth above, according to exemplary embodiments in the present disclosure, ESL of the multilayer capacitor may be decreased, and durability and reliability of the multilayer capacitor may be improved.

While exemplary embodiments have been shown and described above, it will be apparent to those skilled in the art that modifications and variations could be made without departing from the scope of the present invention as defined by the appended claims.

What is claimed is:

1. A multilayer capacitor comprising:
a body including a plurality of dielectric layers stacked therein in a width direction, and a plurality of first and second internal electrodes alternately disposed with respective dielectric layers interposed therebetween; and
first, second and third external electrodes disposed on a mounting surface of the body to be spaced apart from each other in a length direction of the body,
wherein the first internal electrode includes a first main portion and first and second lead portions extended from the first main portion to thereby be exposed to the mounting surface of the body, the first and second lead portions being disposed to be spaced apart from each other in the length direction of the body, and connected to the first and third external electrodes, respectively,
the second internal electrode includes a second main portion overlapping the first main portion and a third lead portion extended from the second main portion to thereby be exposed to the mounting surface of the body, the third lead portion being disposed between the first and second lead portions in the length direction and connected to the second external electrode, and
the first, second and third external electrodes each include first, second and third electrode layers which are sequentially stacked, the first and second electrode layers containing metal and glass particles, and the third electrode layer containing a conductive resin, and
a portion of the first electrode layer of the first, second and third external electrodes is in direct contact with the third electrode layer of the first, second and third external electrodes, respectively.

2. The multilayer capacitor of claim 1, wherein the first and third external electrodes are disposed to be spaced apart from both surfaces of the body in the length direction.

3. The multilayer capacitor of claim 1, wherein the first electrode layers of the first, second and third external electrodes extend from the mounting surface of the body to portions of both surfaces of the body in the width direction, respectively, the second electrode layers of the first, second and third external electrodes extend from the both surfaces of the body in the width direction to portions of the first electrode layers, respectively, and the third electrode layers of the first, second and third external electrodes are disposed to cover the first and second electrode layers, respectively.

4. The multilayer capacitor of claim 3, wherein the second and third electrode layers of the first, second and third external electrodes extend to portions of a surface of the body opposing the mounting surface of the body, respectively.

5. The multilayer capacitor of claim 1, wherein the first, second and third external electrodes further include plating layers formed on the third electrode layers, respectively.

6. The multilayer capacitor of claim 1, wherein the first and second internal electrodes are disposed to be spaced apart from both surfaces of the body in the length direction.

7. A multilayer capacitor comprising:
a body including a plurality of dielectric layers stacked therein in a width direction, and a plurality of first and second internal electrodes alternately disposed with respective dielectric layers interposed therebetween; and
first, second and third external electrodes disposed on a mounting surface of the body to be spaced apart from each other in a length direction of the body,
wherein the first internal electrode includes a first main portion and first and second lead portions extended from the first main portion to thereby be exposed to the mounting surface of the body, the first and second lead portions being disposed to be spaced apart from each other in the length direction of the body, and connected to the first and third external electrodes, respectively,
the second internal electrode includes a second main portion overlapping the first main portion and a third lead portion extended from the second main portion to thereby be exposed to the mounting surface of the body, the third lead portion being disposed between the first and second lead portions in the length direction and connected to the second external electrode, and
the first, second and third external electrodes each include first, second and third electrode layers which are sequentially stacked, the first and second electrode layers containing metal and glass particles, and the third electrode layer containing a conductive resin,
wherein the first electrode layer of the second external electrode extends from the mounting surface of the body to portions of both surfaces of the body in the width direction, the second electrode layer of the second external electrode is extended from the both surfaces of the body in the width direction to portions of the first electrode layer, and the third electrode layer of the second external electrode is disposed to cover the first and second electrode layers, and the first electrode layers of the first and third external electrodes extend from the mounting surface of the body to portions of the both surfaces of the body in the width direction, respectively, the second electrode layers of the first and third external electrodes extend from opposing surfaces of the body in the length direction to portions of the first electrode layers, respectively, and the third electrode layers of the first and third external electrodes are disposed to cover the first and second electrode layers, respectively, and a portion of the first electrode layer of the first, second and third external electrodes is in direct contact with the third electrode layer of the first, second and third external electrodes, respectively.

8. The multilayer capacitor of claim 7, wherein the second and third electrode layers of the first, second and third external electrodes extend to portions of a surface of the body opposing the mounting surface of the body, respectively.

9. The multilayer capacitor of claim 7, wherein the first, second and third external electrodes further include plating layers formed on the third electrode layers, respectively.

10. A board having a multilayer capacitor, the board comprising:
   a circuit board on which first, second and third electrode pads are formed; and
   the multilayer capacitor of claim 1, mounted on the circuit board so that the first, second and third external electrodes are disposed on the first, second and third electrode pads, respectively.

* * * * *